US006534241B2

(12) United States Patent
Fromson et al.

(10) Patent No.: US 6,534,241 B2
(45) Date of Patent: Mar. 18, 2003

(54) METHOD OF ACTINICALLY IMAGING A SEMICONDUCTOR

(75) Inventors: Howard A. Fromson, 43 Main St., Stonington, CT (US) 06378; William J. Rozell, Vernon, CT (US)

(73) Assignee: Howard A. Fromson, Stonington, CT (US)

( * ) Notice: Subject to any disclaimer, the term of this patent is extended or adjusted under 35 U.S.C. 154(b) by 0 days.

(21) Appl. No.: 10/081,597

(22) Filed: Feb. 22, 2002

(65) Prior Publication Data

US 2002/0127492 A1 Sep. 12, 2002

Related U.S. Application Data

(63) Continuation-in-part of application No. 09/653,726, filed on Sep. 1, 2000, now Pat. No. 6,355,398, which is a continuation-in-part of application No. 09/482,483, filed on Jan. 12, 2000, now abandoned.

(51) Int. Cl.$^7$ ................................................ G03F 7/004
(52) U.S. Cl. ...................... 430/302; 430/311; 430/330; 430/348; 430/944; 430/945; 101/463.1; 438/795
(58) Field of Search .............................. 430/270.1, 302, 430/311, 330, 346, 348, 349, 945, 944; 101/463.1; 438/795

(56) References Cited

U.S. PATENT DOCUMENTS

| 3,902,010 | A | | 8/1975 | Goshima | 178/6.7 A |
|---|---|---|---|---|---|
| 4,053,898 | A | | 10/1977 | Hirayama et al. | 346/1 |
| 4,383,261 | A | | 5/1983 | Goldberg | 346/1.1 |
| 4,530,080 | A | | 7/1985 | Aoi et al. | 369/45 |
| 5,045,697 | A | | 9/1991 | Schneider | 250/316.1 |
| 5,705,322 | A | | 1/1998 | West et al. | 430/325 |
| 5,858,626 | A | | 1/1999 | Sheriff et al. | 430/326 |
| 5,932,394 | A | | 8/1999 | Van Hunsel et al. | 430/302 |
| 5,934,196 | A | | 8/1999 | Korem | 101/467 |
| 5,950,542 | A | | 9/1999 | Harris et al. | 101/457 |
| 5,967,048 | A | | 10/1999 | Fromson et al. | 101/463.1 |
| 6,004,721 | A | * | 12/1999 | Tan et al. | 430/270.1 |
| 6,060,217 | A | | 5/2000 | Nguyen et al. | 430/302 |
| 6,136,504 | A | * | 10/2000 | Tan et al. | 430/270.1 |
| 6,187,509 | B1 | * | 2/2001 | Imai et al. | 430/284.1 |
| 6,218,083 | B1 | | 4/2001 | McCullough et al. | 430/326 |
| 6,267,055 | B1 | | 7/2001 | Fromson et al. | 101/467 |
| 6,348,297 | B1 | | 2/2002 | Uetani et al. | 430/270.1 |
| 2002/0081517 | A1 | * | 6/2002 | Fromson et al. | 430/165 |

FOREIGN PATENT DOCUMENTS

JP          200-347398 A   * 12/2000   ........... G03F/7/027

* cited by examiner

*Primary Examiner*—Janet Baxter
*Assistant Examiner*—Barbara Gilliam
(74) *Attorney, Agent, or Firm*—Alix, Yale & Ristas, LLP

(57) ABSTRACT

A coated imageable semiconductor is imaged by heating an area of the coating with an infrared laser and reacting the coating in the heated area with ultraviolet or visible radiation. The coating can be either positive working or negative working. The modulated radiation may either be the ultraviolet/visible radiation or the infrared radiation and the radiation spots are superimposed or the ultraviolet/visible spot may closely trail the infrared spot. The imaging time is reduced since the reaction rate is increased at the elevated temperature.

25 Claims, No Drawings

METHOD OF ACTINICALLY IMAGING A SEMICONDUCTOR

This application is a continuation-in-part application of U.S. patent application Ser. No. 09/653,726 filed Sep. 1, 2000 now U.S. Pat. No. 6,355,398, which is a continuation-in-part application of U.S. patent application Ser. No. 09/482,483 filed Jan. 12, 2000 now abandoned.

BACKGROUND OF THE INVENTION

The present invention relates to the imaging of a plate or planar surface having a coating imageable by ultraviolet or visible radiation and more specifically to actinic imaging with simultaneous heating to improve the imaging process. The invention of this application is particularly directed to the imaging of semiconductors.

One type of imageable plate is a negative-working, actinic plate which has a resin coating normally soluble in a developer and which is rendered insoluble when exposed to radiation, usually in the ultraviolet range. The plate is imaged by exposing the coating to the radiation in those areas corresponding to the image to be printed with those areas becoming insoluble and ink receptive. Another type of imageable plate is a positive-working plate which is also actinically imaged. This type of plate has a resin coating normally insoluble in a developer which is rendered soluble when exposed to the radiation.

Actinic imaging, whether it be by ultraviolet radiation or by visible radiation, can be accomplished by one of two techniques. One technique is to expose the plate through a film negative. The other approach is to serially scan the plate with small image spots or areas. This latter approach can be accomplished by digital laser imaging or by a method referred to as digital screen imaging which will be explained later. Although digital screen imaging is not digital imaging in the strictest sense of that term as will be explained, the term "digital" will be used herein to encompass both the digital laser imaging and the digital screen imaging which both involve imaging by serially scanning the plate with small areas or spots of the imaging radiation.

SUMMARY OF THE INVENTION

An object of the present invention is to provide an improved actinic imaging method for either negative-working or positive-working plates or planar surfaces and particularly for semiconductors hereinafter all referred to as plates. The invention involves the imaging of the semiconductor to cause a reaction in the coating in the exposed areas by actinic imaging using either ultraviolet or visible radiation in combination with infrared radiation. The reaction may either solubilize or insolubilize the coating depending on whether the plate is positive- or negative-working. The infrared radiation operates to increase the localized temperature of the coating to a level at which the rate of the actinic imaging reaction is increased. Either the ultraviolet/visible radiation or the infrared radiation can be image modulated. The relative areas covered by the ultraviolet/visible radiation and by the infrared radiation can be varied such that the areas are superimposed or that the area of the ultraviolet/visible radiation closely trails the infrared area.

DESCRIPTION OF THE PREFERRED EMBODIMENT

The invention relates to the imaging of plates or planar surfaces with imageable coatings and particularly to the imaging of semiconductors. The production of semiconductors has usually been performed by adopting the imaging techniques used in the production of lithographic printing plates using imageable resist compositions. The resolution of these imaging techniques can be improved by shortening the wavelength of the exposure radiation in order to limit diffraction.

Accordingly, the wavelengths of the radiation used for semiconductor production have become shorter and shorter. For example, a KrF excimer laser at a wavelength of 248 nm or a ArF excimer laser at a wavelength of 193 nm can be used to obtain higher resolutions. However, since lenses in equipment using ArF excimer lasers have a shorter lifetime, it is advantageous to shorten the exposure time required for imaging. The invention will be described with reference broadly to plates but it is to be understood that the description applies to semiconductors.

Plates with coatings which are imageable by ultraviolet or visible radiation wherein the radiation causes an insolubilizing reaction in the coating for negative-working plates and a solubilizing reaction for positive-working plates are well known. Typically, the insolubilizing reaction for negative-working plates is a crosslinking or photopolymerization reaction but other chemical changes may also insolubilize the coating and are within the scope of the invention. The insolubilized imaged areas become the ink-receptive plate areas and the non-imaged areas are removed with a typical developer solution. The coatings for such plates are well known in the art and are typically a diazo resin having reactive sites which are capable of being chemically altered by the radiation. A suitable diazo resin is the condensation product of 3-methoxy-4 diazo-diphenylamine and paraformaldehyde. Other suitable diazo compounds are described in a variety of prior patents including U.S. Pat. Nos. 5,998,095; 4,956,261; 3,406,159; 3,277,074; 3,311,605; 3,163,633 and 3,050,502. For positive-working plates, the coatings are normally insoluble in the developer solution and are solubilized in the areas exposed to the imaging radiation. Such coatings are well known and usually comprise a diazide, such as diazonaphthoquinone derivatives, mixed with or reacted with a phenolic resin. For a specific disclosure of diazonaphthoquinone derivatives, see U.S. Pat. No. 5,858, 626. The mechanism of such coatings is described in the article, "The Molecular Mechanism of Novolak Resins" by Arnost Reiser appearing in the Journal of Imaging Science and Technology, Volume 42, No. 1, January/February 1998 on pages 15 to 22.

Plates may be imaged by digital laser imaging and by digital screen imaging. The invention will first be described with respect to digital laser imaging and the digital screen imaging will be described later. Also, the invention will be described with respect to negative-working plates with coatings which are insolubilized by the radiation but it is to be recognized that the invention applies equally to positive-working plates with coatings which are solubilized by the radiation. Furthermore, the invention is applicable to imaging radiation with a wavelength shorter than infrared. For convenience purposes, ultraviolet radiation or devices will be referred to but it is to be understood that the imaging radiation of the invention includes visible as well as ultraviolet radiation. For example, blue or violet diode lasers or a double frequency YAG laser at 532 nm can be used. Like most chemical reactions, the rate at which the solubility conversion takes place for the actinic digital imaging of a lithographic plate is dependent on the temperature. The rate of reaction is slower at ambient conditions than at elevated temperatures. By elevating the temperature at which the imaging is done, the speed of the imaging process can be increased. It is problematic to increase the temperature of the entire plate by elevating the temperature of the imaging platen or drum. The thermal expansion of the components of the imager and the dynamics of managing the heat flow to the plate in a timely and uniform manner make this approach impractical.

According to the present invention, the temperature of the resin coating is increased to enhance the reaction but it is only locally and momentarily heated and heated generally simultaneously with the imaging. The invention involves spot heating the coating with an infrared laser and subjecting the coating while it is heated to the ultraviolet radiation to react the coating at the elevated temperature. The coating is not reacted or otherwise imaged by the infrared radiation but the infrared radiation interacts with the coating and/or substrate merely to heat the coating. Either the ultraviolet radiation or the infrared radiation can be image modulated as discussed below. If desired, an infrared absorbing dye may be incorporated into the coating to facilitate the infrared absorption and heating. These dyes are well known in the art and include materials such as squarylium, croconate, cyanine, phthalocyanine, merocyanine, chalcogenopyryloarylidene, orzindollizine, puinoid, indolizine, pyrylium, thizine, azulenium and xanthene dyes. The infrared heating of the coating can also be effected by using a substrate having infrared absorption characteristics. For example, an anodized aluminum substrate which has been rotary brush grained with calcined alumina so as to embed the graining particles to cover a portion, perhaps 10%, of the surface of the substrate will effect the rate of heat absorption by the substrate and the conduction of heat away from the spot by the aluminum. The power and intensity of the infrared laser as well as the dye in the coating and the nature of the substrate can be selected to instantaneously increase the coating temperature to enhance the coating reaction by increasing the reaction kinetics. The effect of the coating temperature on the reaction kinetics is progressive, i.e. the higher the temperature, the faster the reaction. Therefore, any temperature increase will have some effect but the preferred coating temperature range is 250 to 400° F. With the higher coating temperature, much less power or time is required to trigger the reaction. Specifically, with respect to ultraviolet radiation, imaging can be accomplished with much less powerful gas lasers or with a diode or semiconductor ultraviolet laser in the power range of one watt or less. Therefore, the lasers are much less expensive, require less power input, do not require water cooling and are easier to modulate. The ultraviolet radiation is usually in the range of 340 to 390 nm.

In the practice of the invention, either the infrared radiation or the ultraviolet radiation may be image modulated. With modulated ultraviolet radiation, the unmodulated infrared radiation heats an area of the coating which is simultaneously imaged with superimposed modulated ultraviolet radiation. The spot of modulated ultraviolet radiation can be smaller than or the same size as the spot of infrared radiation. Alternately, the modulated spot of ultraviolet radiation can closely trail the unmodulated spot of infrared radiation with the criteria being that the coating is still hot at the time it is subjected to the ultraviolet radiation. With modulated infrared radiation, an area of the coating is exposed to a relatively low level of unmodulated ultraviolet radiation and that spot is simultaneously exposed to the superimposed modulated infrared radiation. The infrared spot is either the same size or smaller than the ultraviolet spot. The level of ultraviolet radiation is low enough that it will not significantly react the coating at ambient temperature during the short exposure time. It is only because of the simultaneous heating that the ultraviolet radiation is sufficient to react the coating in the heated image pattern formed by the infrared radiation.

In order to locally heat the coating and simultaneously image, the spots on the plate from the infrared laser and the digital imager must be located such that the imaging is effected while the coating is hot. This usually requires that the spots be superimposed although the ultraviolet spot may closely trail the infrared spot as noted earlier. Although the spots can be the same size, in order to facilitate superimposition and taking into consideration the ability to aim and focus on the lasers, one spot is preferably larger than the other with the small spot being entirely within the bounds of the larger spot. The small spot is the modulated radiation whether that be ultraviolet or infrared. Because this ultraviolet imaging is a progressive process (rather than a threshold process) in which exposure of the coating to moderate levels of the ultraviolet radiation could produce some imaging, the ultraviolet spot is usually the modulated imaging radiation and is the smaller of the two spots with the ultraviolet spot being fully contained within the bounds of the infrared spot. Merely as an example, the large infrared spot may have a diameter of 50 microns while the small digital image spot has a diameter of 10 microns. If the infrared radiation is the modulated radiation, the infrared spot will be the smaller and the level of the ultraviolet radiation is kept quite low so that any coating reaction caused solely by the unmodulated ultraviolet radiation is minimal and insufficient to produce an effective image. Although this description of the invention only contemplates a single pair of infrared and ultraviolet lasers, there can simultaneously be multiple infrared and ultraviolet lasers.

Another method of imaging within the scope of the present invention is by a digital screen imaging system such as marketed by basysPrint Corp. This system uses a radiation source which is usually an ultraviolet light source that passes through a condenser system onto a digital screen. This screen has a grid with hundreds of thousands of dots that can each be individually electronically controlled. This produces a digital image on the screen that is projected onto the printing plate. It can be seen that it is the screen image that is digital whereas the image on the plate is a projected image from that digital screen. However, as previously stated, this imaging technique is encompassed with the scope of the digital imaging of this invention. Because of the size of the digital screen, only a segment of the plate is imaged in a single exposure. The segments range in size from 0.3 cm$^2$ to 2.5 cm$^2$ and can be projected at the rate of about 10 segments per second. The exposure head is moved or scanned over the plate to fit the segments together and produce the entire image on the plate. With this type of digital imager, one or more infrared lasers are positioned off to the side and aimed at an angle to focus on the area beneath the digital screen.

The imaging of the invention may be practiced on any conventional imaging equipment such as flat bed imagers, internal drum imagers and external drum imagers. In order to establish the principal and effectiveness of the present invention and the benefits achieved when imaging a coating at an elevated temperature, conventional plates with ultraviolet imageable coatings were heated to bring the coated plates up to a selected temperature. The heated plates were then imaged with ultraviolet light. The results were compared to unheated plates and to plates which had been heated but cooled prior to imaging.

COMPARATIVE EXAMPLE 1

An Anocoil Waterworks plate, commercially available from Anocoil Corporation of Rockville, Conn., was imaged at 250 mJ/cm$^2$ using a Theimer Copymat 64-CP exposure unit having a 2500 watt MuHi spectrum bulb. The exposure negative contained a 21 step Stouffer step wedge. This step wedge is essentially a series of steps with increasing optical density. Each step represents an increase in optical density of 50% more than the preceding step. The plate was processed through an Anocoil Plate Processor filled with Anocoil S Developer. The step wedge reading on the plate after imaging was a 6.

COMPARATIVE EXAMPLE 2

A plate was heated to a temperature of 90° C. The plate was subsequently allowed to cool for five minutes to allow it to return to ambient temperature conditions. The plate was imaged and processed as in Comparative Example 1. The step wedge on the plate was a 6.

EXAMPLE 3

A plate was heated to a temperature of 90° C. and imaged on the Theimer exposure unit while still at elevated temperature. The plate was processed as in Comparative Example 1. The step wedge reading was a 7. This indicates an increase in the imaging speed of approximately 50% over that of Comparative Example 1.

EXAMPLE 4

A plate was made in the manner of Example 3 except that the temperature to which the plate was heated was 180° C. In this case the step wedge reading was 7.5. This indicates an increase in imaging speed of approximately 75% relative to that of Comparative Example 1.

The preceding examples demonstrate the advantage of imaging a plate while the plate is maintained at elevated temperatures during the ultraviolet exposure. Comparative Example 2 demonstrates that the mechanism of the present invention differs from other prior art where a preheat is used to effect a change in one component of the coating which then renders it imageable. Comparative Example 2 shows that after cooling the plate has exactly the same imaging characteristics as the unheated plate. There was no conversion of any coating component as a result of the heating. The present invention relies on the concurrent infrared heating and imaging exposure processes to effect the selective imaging. This establishes the dynamic relationship between the heating and imaging as practiced with the present invention. With the increased reaction time, exposure times can be reduced thus speeding up the process and subjecting the laser lenses to less exposure.

What is claimed is:

1. A method of imaging a semiconductor having a coating which is actinically imageable by radiation of a selected wavelength which is shorter than the wavelength of infrared radiation and which is in the range of ultraviolet and visible radiation comprising:
   a. focusing a source of infrared radiation onto a first area on said semiconductor to heat said coating in said first area;
   b. simultaneously imaging a second area of said heated coating within the bounds of said first area with image producing radiation of said selected wavelength; and
   c. repeating steps a and b for successive areas of said semiconductor.

2. A method as recited in claim 1 wherein said coating contains an infrared absorbing dye.

3. A method as recited in claim 1 wherein said step of simultaneously imaging comprises creating said image producing radiation of said selected wavelength with a modulated laser.

4. A method as recited in claim 3 wherein said semiconductor is positive-working and said coating is solubilized by said imaging radiation.

5. A method as recited in claim 4 wherein said radiation of said selected wavelength is ultraviolet radiation and said modulated laser is an ultraviolet laser.

6. A method as recited in claim 1 wherein said step of simultaneously imaging comprises creating said image producing radiation of said selected wavelength with a digital screen.

7. A method as recited in claim 6 wherein said semiconductor is negative-working and said coating is insolubilized by said imaging radiation.

8. A method as recited in claim 7 wherein said radiation of said selected wavelength is ultraviolet radiation and said step of creating said image producing radiation with a digital screen comprises passing ultraviolet radiation through said digital screen onto said coating.

9. A method of imaging an ultraviolet sensitive semiconductor having a resin coating capable of being insolubilized by ultraviolet radiation comprising:
   a. focusing an unmodulated source of infrared energy onto a first area on said semiconductor to heat said coating in said first area; and
   b. simultaneously focusing a source of ultraviolet energy through a digitally generated screen to produce an ultraviolet image within a second area on said semiconductor, said second area being smaller than said first area and within the bounds of said first area whereby said heated coating is insolubilized by said ultraviolet image within said second area.

10. A method as recited in claim 9 wherein said resin coating contains an infrared absorbing dye.

11. A method of imaging a semiconductor having an imageable resin coating which is insolubilized by ultraviolet radiation comprising the steps of:
   a. scanning said semiconductor with an unmodulated infrared laser beam focused to a first spot on said semiconductor of a first size to heat said coating at said first spot; and
   b. simultaneously scanning said semiconductor with an ultraviolet image focused to a second spot on said semiconductor of a second size smaller than said first size and within the bounds of said first spot whereby said heated coating within said first spot is insolubilized by said ultraviolet image within said second spot.

12. A method as recited in claim 11 wherein said ultraviolet image is created by a modulated laser beam.

13. A method as recited in claim 11 wherein said ultraviolet image is created by a digital screen.

14. A method of imaging a semiconductor having a resin coating which is actinically imageable by radiation of a selected wavelength which is in the range of ultraviolet and visible radiation and which is shorter than the wavelength of infrared radiation comprising:
   a. focusing an unmodulated infrared laser beam onto a first spot on said semiconductor to heat said resin coating at said first spot; and
   b. simultaneously focusing an image modulated source of energy of said selected wavelength onto a second spot on said semiconductor, said second spot being smaller than said first spot and within the bounds of said first spot whereby said heated coating is actinically imaged within said second spot.

15. A method as recited in claim 14 wherein said actinic imaging comprises insolubilizing said heated coating.

16. A method as recited in claim 14 wherein said actinic imaging comprises solubilizing said heated coating.

17. A method of imaging a semiconductor having a coating which is actinically imageable by radiation of a selected wavelength which is shorter than the wavelength of infrared radiation and which is in the range of ultraviolet and visible radiation comprising:
   a. focusing a spot of infrared radiation onto an area on said semiconductor to heat said coating in said area;
   b. focusing a spot of radiation of said selected wavelength onto said heated coating in said area;
   c. image modulating one of said sources of radiation thereby imaging said coating in said heated area;
   d. repeating steps a, b and c for successive areas of said semiconductor.

18. A method as recited in claim 17 wherein said radiation of said selected wavelength is modulated.

19. A method as recited in claim 18 wherein said spot of radiation of said selected wavelength and said spot of infrared radiation are simultaneously focused onto said area.

20. A method as recited in claim 19 wherein said spot of radiation of said selected wavelength and said spot of infrared radiation are the same size.

21. A method as recited in claim 19 wherein said spot of radiation of said selected wavelength is smaller than said spot of infrared radiation.

22. A method as recited in claim 17 wherein said spot of radiation of said selected wavelength is focused onto said heated coating in said area subsequent to said focusing of said infrared radiation onto said area and heating said coating in said area.

23. A method as recited in claim 17 wherein said infrared radiation is modulated.

24. A method as recited in claim 23 wherein said spot of radiation of said selected wavelength and said spot of infrared radiation are the same size and said spots are simultaneously focused onto said area.

25. A method as recited in claim 23 wherein said spot of radiation of said selected wavelength is larger than said spot of infrared radiation and said spots are simultaneously focused onto said area.

* * * * *